United States Patent
Hall

(10) Patent No.: US 9,207,904 B2
(45) Date of Patent: Dec. 8, 2015

(54) MULTI-PANEL DISPLAY WITH HOT SWAPPABLE DISPLAY PANELS AND METHODS OF SERVICING THEREOF

(71) Applicant: Ultravision Technologies, LLC, Dallas, TX (US)

(72) Inventor: William Y. Hall, Dallas, TX (US)

(73) Assignee: Ultravision Technologies, LLC, Dallas, TX (US)

( * ) Notice: Subject to any disclaimer, the term of this patent is extended or adjusted under 35 U.S.C. 154(b) by 0 days.

(21) Appl. No.: 14/720,560

(22) Filed: May 22, 2015

(65) Prior Publication Data
US 2015/0254046 A1  Sep. 10, 2015

Related U.S. Application Data

(63) Continuation-in-part of application No. PCT/US2014/072373, filed on Dec. 24, 2014, and a continuation-in-part of application No. 14/341,678, filed on Jul. 25, 2014, and a continuation-in-part of (Continued)

(51) Int. Cl.
*G02F 1/1333* (2006.01)
*G06F 3/14* (2006.01)
(Continued)

(52) U.S. Cl.
CPC ............ *G06F 3/1446* (2013.01); *G06F 1/1601* (2013.01); *G06F 1/188* (2013.01); *G06F 1/189* (2013.01); *G06F 3/147* (2013.01); *G09F 9/3023* (2013.01); *G09F 13/22* (2013.01); *H01B 7/2825* (2013.01); *G02F 1/133308* (2013.01); *G09F 2013/222* (2013.01); *G09G 3/32* (2013.01); *G09G 2300/026* (2013.01);

(Continued)

(58) Field of Classification Search
None
See application file for complete search history.

(56) References Cited

U.S. PATENT DOCUMENTS 4,457,090 A  7/1984  McDonough
4,497,125 A  2/1985  Hutchinson
(Continued)

FOREIGN PATENT DOCUMENTS

CN  201449702  5/2010
CN  201540699  8/2010
(Continued)

OTHER PUBLICATIONS

Daktronics, "The Smarter Approach to Digital Outdoor," Daktronics Digital Billboard Products, 2013, 16 pages.
(Continued)

*Primary Examiner* — Kris Rhu
(74) *Attorney, Agent, or Firm* — Slater & Matsil, LLP

(57) ABSTRACT

A method includes providing access to a multi-panel display including a plurality of display panels. Each panel of the plurality of display panels is mounted onto a mechanical support structure. The method further includes identifying a defective panel from the plurality of display panels. Without powering down the multi-panel display, electrical connection to the defective panel is disconnected and the defective panel is removed from the mechanical support structure. The method also includes attaching a replacement display panel to the mechanical support structure at the location of the defective panel, and connecting power to the replacement display panel. One or more of the remaining of the plurality of display panels continue to display during the time the defective panel is disconnected and removed, and the replacement display is attached.

28 Claims, 16 Drawing Sheets

Related U.S. Application Data application No. 14/444,719, filed on Jul. 28, 2014, now Pat. No. 9,134,773, and a continuation-in-part of application No. 14/444,775, filed on Jul. 28, 2014, now Pat. No. 9,081,552, and a continuation-in-part of application No. 14/444,747, filed on Jul. 28, 2014, now Pat. No. 9,069,519.

(60) Provisional application No. 62/158,707, filed on May 8, 2015, provisional application No. 62/113,342, filed on Feb. 6, 2015, provisional application No. 62/093,157, filed on Dec. 17, 2014, provisional application No. 62/065,510, filed on Oct. 17, 2014, provisional application No. 62/025,463, filed on Jul. 16, 2014, provisional application No. 61/922,631, filed on Dec. 31, 2013.

(51) Int. Cl.
| | |
|---|---|
| *H01L 27/32* | (2006.01) |
| *G06F 3/147* | (2006.01) |
| *G06F 1/16* | (2006.01) |
| *G06F 1/18* | (2006.01) |
| *G09F 13/22* | (2006.01) |
| *H01B 7/282* | (2006.01) |
| *G09F 9/302* | (2006.01) |
| *G09G 3/32* | (2006.01) |
| *H04N 7/00* | (2011.01) |

(52) U.S. Cl.
CPC ..... *G09G 2320/029* (2013.01); *G09G 2330/08* (2013.01); *G09G 2330/10* (2013.01); *G09G 2330/12* (2013.01); *G09G 2360/04* (2013.01); *H01L 27/3293* (2013.01); *H04N 7/00* (2013.01)

(56) References Cited

U.S. PATENT DOCUMENTS

| | | | |
|---|---|---|---|
| 4,782,336 A | 11/1988 | Bailey | |
| 4,964,231 A | 10/1990 | De Maat et al. | |
| 5,172,504 A | 12/1992 | De Maat et al. | |
| 5,341,088 A | 8/1994 | Davis | |
| 5,523,769 A | 6/1996 | Lauer et al. | |
| 5,600,910 A | 2/1997 | Blackburn | |
| 5,722,767 A | 3/1998 | Lin | |
| 5,796,376 A | 8/1998 | Banks | |
| 5,900,850 A | 5/1999 | Bailey et al. | |
| 5,949,581 A | 9/1999 | Kurtenbach et al. | |
| 5,990,802 A | 11/1999 | Maskeny | |
| 6,045,240 A | 4/2000 | Hochstein | |
| 6,065,854 A | 5/2000 | West et al. | |
| 6,114,632 A | 9/2000 | Planas, Sr. et al. | |
| 6,175,342 B1 | 1/2001 | Nicholson et al. | |
| 6,237,290 B1 | 5/2001 | Tokimoto et al. | |
| 6,314,669 B1 | 11/2001 | Tucker | |
| 6,362,801 B1 | 3/2002 | Yuhara | |
| 6,414,650 B1 * | 7/2002 | Nicholson et al. | 345/1.1 |
| 6,570,548 B2 | 5/2003 | Smith | |
| 6,634,124 B1 | 10/2003 | Bierschbach | |
| 6,657,605 B1 | 12/2003 | Boldt, Jr. et al. | |
| 6,677,918 B2 | 1/2004 | Yuhara et al. | |
| 6,737,983 B1 | 5/2004 | Temple | |
| 6,741,222 B1 | 5/2004 | Tucker | |
| 6,810,612 B2 | 11/2004 | Huang | |
| 6,813,853 B1 | 11/2004 | Tucker | |
| 6,819,303 B1 | 11/2004 | Berger et al. | |
| 6,998,538 B1 | 2/2006 | Fetterolf, Sr. et al. | |
| 7,055,271 B2 | 6/2006 | Lutz et al. | |
| 7,072,407 B2 | 7/2006 | Schurig | |
| 7,086,188 B2 | 8/2006 | Tsao | |
| 7,091,933 B2 | 8/2006 | McClintock et al. | |
| 7,161,558 B1 | 1/2007 | Eidem et al. | |
| 7,170,480 B2 | 1/2007 | Boldt, Jr. et al. | |
| 7,204,602 B2 | 4/2007 | Archer | |
| 7,267,459 B2 | 9/2007 | Matheson | |
| 7,319,408 B2 | 1/2008 | Temple | |
| 7,334,361 B2 | 2/2008 | Schrimpf et al. | |
| 7,355,562 B2 | 4/2008 | Schubert et al. | |
| 7,450,085 B2 | 11/2008 | Thielemans et al. | |
| 7,495,576 B2 | 2/2009 | Maskeny et al. | |
| 7,502,950 B1 | 3/2009 | Brands | |
| 7,557,781 B2 | 7/2009 | Chuang et al. | |
| 7,605,772 B2 | 10/2009 | Syrstad | |
| 7,674,000 B2 | 3/2010 | Valerio, Jr. et al. | |
| 7,688,280 B2 | 3/2010 | Callegari et al. | |
| 7,694,444 B2 | 4/2010 | Miller et al. | |
| 7,703,941 B2 | 4/2010 | Lee | |
| 7,774,968 B2 | 8/2010 | Nearman et al. | |
| 7,779,568 B2 | 8/2010 | Gettelfinger et al. | |
| 7,797,865 B2 | 9/2010 | Patel et al. | |
| 7,868,903 B2 | 1/2011 | Wendler et al. | |
| 7,869,198 B1 | 1/2011 | Nearman et al. | |
| 7,907,133 B2 | 3/2011 | Joffer et al. | |
| 7,926,213 B1 | 4/2011 | Kludt et al. | |
| 7,950,174 B2 | 5/2011 | Xu | |
| 7,971,378 B2 | 7/2011 | Campoy Odena | |
| 8,007,121 B2 | 8/2011 | Elliott et al. | |
| 8,016,452 B2 | 9/2011 | Dunn | |
| 8,066,403 B2 | 11/2011 | Sanfilippo et al. | |
| 8,074,387 B2 | 12/2011 | Mancuso | |
| 8,081,145 B2 | 12/2011 | Ronkholz et al. | |
| 8,104,204 B1 | 1/2012 | Syrstad | |
| 8,111,208 B2 | 2/2012 | Brown | |
| 8,115,229 B2 | 2/2012 | Christy | |
| 8,122,627 B2 | 2/2012 | Miller | |
| 8,130,175 B1 | 3/2012 | Joffer et al. | |
| 8,136,279 B2 | 3/2012 | Nearman et al. | |
| 8,154,864 B1 | 4/2012 | Nearman et al. | |
| 8,156,672 B2 | 4/2012 | Xu | |
| 8,168,990 B2 | 5/2012 | Christy | |
| 8,172,097 B2 | 5/2012 | Nearman et al. | |
| 8,184,114 B2 | 5/2012 | Oh et al. | |
| 8,228,261 B2 | 7/2012 | Callegari et al. | |
| 8,281,344 B1 * | 10/2012 | Mathias | 725/74 |
| 8,301,939 B2 | 10/2012 | Gloege et al. | |
| 8,314,433 B2 | 11/2012 | Christy | |
| 8,344,410 B2 * | 1/2013 | Wendler et al. | 257/99 |
| 8,350,788 B1 | 1/2013 | Nearman et al. | |
| 8,362,696 B2 | 1/2013 | Zheng | |
| 8,414,149 B2 | 4/2013 | Nearman | |
| 8,434,898 B2 | 5/2013 | Sanfilippo et al. | |
| 8,552,928 B2 | 10/2013 | Wendler et al. | |
| 8,558,755 B2 | 10/2013 | Kharrati et al. | |
| 8,599,108 B2 | 12/2013 | Kline et al. | |
| 8,604,509 B2 | 12/2013 | Wendler et al. | |
| 8,648,774 B2 | 2/2014 | Kline et al. | |
| 8,702,048 B2 | 4/2014 | Kludt et al. | |
| 8,714,665 B2 | 5/2014 | Campagna et al. | |
| 8,766,880 B2 | 7/2014 | Kharrati et al. | |
| 8,803,766 B2 | 8/2014 | Kline et al. | |
| 8,824,124 B1 | 9/2014 | Carlson et al. | |
| 8,824,125 B1 | 9/2014 | Cox et al. | |
| 2002/0126086 A1 | 9/2002 | Takeuchi et al. | |
| 2002/0176267 A1 * | 11/2002 | Tanaka et al. | 363/78 |
| 2003/0146882 A1 | 8/2003 | Ogino et al. | |
| 2004/0008155 A1 | 1/2004 | Cok | |
| 2004/0196049 A1 | 10/2004 | Yano et al. | |
| 2004/0222941 A1 | 11/2004 | Wong et al. | |
| 2005/0052374 A1 | 3/2005 | Devos et al. | |
| 2005/0052375 A1 | 3/2005 | Devos et al. | |
| 2005/0078104 A1 * | 4/2005 | Matthies et al. | 345/204 |
| 2005/0134526 A1 | 6/2005 | Willem et al. | |
| 2005/0178034 A1 | 8/2005 | Schubert et al. | |
| 2005/0189311 A1 | 9/2005 | Colby et al. | |
| 2005/0190520 A1 | 9/2005 | Schomaker et al. | |
| 2005/0264471 A1 | 12/2005 | Yamazaki et al. | |
| 2006/0039142 A1 | 2/2006 | Temple | |
| 2006/0132048 A1 | 6/2006 | Popovich | |
| 2006/0164587 A1 | 7/2006 | Oh | |
| 2006/0185612 A1 * | 8/2006 | Bonner et al. | 119/455 |
| 2006/0241878 A1 | 10/2006 | Jung et al. | |
| 2006/0256033 A1 | 11/2006 | Chan et al. | |

(56) References Cited

U.S. PATENT DOCUMENTS

| | | |
|---|---|---|
| 2007/0000849 A1 | 1/2007 | Lutz et al. |
| 2007/0279314 A1 | 12/2007 | Brown |
| 2008/0047184 A1 | 2/2008 | Dean |
| 2008/0078733 A1 | 4/2008 | Nearman et al. |
| 2008/0141571 A1 | 6/2008 | Kottwitz |
| 2008/0266206 A1 | 10/2008 | Nelson et al. |
| 2008/0285087 A1 | 11/2008 | Perkins et al. |
| 2008/0303747 A1 | 12/2008 | Velicescu |
| 2009/0024929 A1 | 1/2009 | Gloege et al. |
| 2009/0073080 A1 | 3/2009 | Meersman et al. |
| 2009/0096711 A1 | 4/2009 | Jang et al. |
| 2009/0146910 A1 | 6/2009 | Gardner |
| 2009/0146919 A1 | 6/2009 | Kline et al. |
| 2009/0147028 A1 | 6/2009 | Sefton et al. |
| 2009/0251391 A1 | 10/2009 | Ng et al. |
| 2009/0289160 A1 | 11/2009 | Kludt et al. |
| 2009/0322251 A1 | 12/2009 | Hilgers |
| 2010/0123732 A1 | 5/2010 | Jenks et al. |
| 2010/0251583 A1 | 10/2010 | Brown et al. |
| 2010/0288895 A1 | 11/2010 | Shamie |
| 2010/0295424 A1 | 11/2010 | Alexander |
| 2010/0309185 A1* | 12/2010 | Koester et al. ............ 345/211 |
| 2011/0025696 A1* | 2/2011 | Wyatt et al. ............... 345/502 |
| 2011/0096568 A1 | 4/2011 | Schattinger et al. |
| 2011/0134640 A1 | 6/2011 | Bertele |
| 2011/0168653 A1 | 7/2011 | Garrett et al. |
| 2011/0205757 A1 | 8/2011 | Whyte |
| 2011/0267328 A1 | 11/2011 | Venkatasubramanian et al. |
| 2012/0005563 A1 | 1/2012 | Gloege et al. |
| 2012/0019490 A1 | 1/2012 | Huang |
| 2012/0021873 A1 | 1/2012 | Brunner |
| 2012/0062540 A1 | 3/2012 | Quadri et al. |
| 2012/0112235 A1 | 5/2012 | Preuschl et al. |
| 2012/0218753 A1 | 8/2012 | Joffer et al. |
| 2012/0236509 A1 | 9/2012 | Cope et al. |
| 2012/0248950 A1 | 10/2012 | Nibori |
| 2012/0299480 A1 | 11/2012 | Peting et al. |
| 2013/0002634 A1 | 1/2013 | Wendler et al. |
| 2013/0271973 A1 | 10/2013 | Rycyna, III |
| 2013/0279161 A1 | 10/2013 | Pickard et al. |
| 2014/0259645 A1 | 9/2014 | Cox et al. |
| 2014/0267896 A1 | 9/2014 | Cox et al. |
| 2015/0145851 A1 | 5/2015 | Takeda et al. |
| 2015/0205565 A1 | 7/2015 | Koguchi |

FOREIGN PATENT DOCUMENTS

| | | |
|---|---|---|
| CN | 202383944 | 8/2012 |
| WO | 2005083660 | 9/2005 |
| WO | 2014005600 | 1/2014 |

OTHER PUBLICATIONS

Daktronics, "Daktronics LED Billboard Technology," www.daktronics.com Nov. 14, 2013, 3 pages.

EKTA, "WOWStrip," www.ekta-led.com, Jun. 19, 2014, 5 pages.

WOWstrip Semi-Transparent LED Displays product page, http://www.ekta-led.com/prod/68/17/190/, retrieved Jun. 19, 2014, 3 pages.

"What is IP? Explained: Ingress Protection rating (IP Rating, IP65-IP68) system," Waterproof TVs Direct; Apr. 11, 2012; http://waterproftvs-direct.co.uk/blog/waterproof-tv/what-is-ip-ip-explained-ingress-protection-rating-ip-rating-ip65-ip68-system.

International Search Report and Written Opinion received in International Application No. PCT/US2014/072373 mailed May 27, 2015, 19 pages.

* cited by examiner

MULTI-PANEL DISPLAY WITH HOT SWAPPABLE DISPLAY PANELS AND METHODS OF SERVICING THEREOF

This application claims priority from U.S. Provisional Application 62/158,707 filed on May 8, 2015, and U.S. Provisional Application No. 62/113,342 filed on Feb. 6, 2015 and is a continuation in part of PCT Application No. PCT/US2014/72373, filed on Dec. 24, 2014, which application claims the benefit of each of the following applications: U.S. Provisional Application No. 62/093,157, filed on Dec. 17, 2014, U.S. Provisional Application No. 62/065,510, filed on Oct. 17, 2014, U.S. Provisional Application No. 62/025,463, filed on Jul. 16, 2014, and U.S. Provisional Application No. 61/922,631, filed on Dec. 31, 2013, U.S. Non Provisional application Ser. No. 14/341,678, filed on Jul. 25, 2014, U.S. Non Provisional application Ser. No. 14/444,719, filed on Jul. 28, 2014, U.S. Non Provisional application Ser. No. 14/444,775, filed on Jul. 28, 2014, U.S. Non Provisional application Ser. No. 14/444,747, filed on Jul. 28, 2014. All the above applications are incorporated herein by reference.

TECHNICAL FIELD

The present invention relates generally to displays, and, in particular embodiments, to a multi-panel display with hot swappable display panels and methods of servicing thereof.

BACKGROUND

Large displays (e.g., billboards), such as those commonly used for advertising in cities and along roads, generally have one or more pictures and/or text that are to be displayed under various light and weather conditions. As technology has advanced and introduced new lighting devices such as the light emitting diode (LED), such advances have been applied to large displays. An LED display is a flat panel display, which uses an array of light-emitting diodes. A large display may be made of a single LED display or a panel of smaller LED panels. LED panels may be conventional panels made using discrete LEDs or surface-mounted device (SMD) panels. Most outdoor screens and some indoor screens are built around discrete LEDs, which are also known as individually mounted LEDs. A cluster of red, green, and blue diodes, or alternatively, a tri-color diode, is driven together to form a full-color pixel, usually square in shape. These pixels are spaced evenly apart and are measured from center to center for absolute pixel resolution.

Many LED display manufacturers sell displays with different resolutions. A present disadvantage of these LED displays is that each one must be a different size to accommodate the pitch needed to obtain the desired resolution. In turn, the existing cabinets and mounting structures must be built to be suitable with the size of the displays.

SUMMARY

In accordance with an embodiment of the present invention, a method includes providing access to a multi-panel display including a plurality of display panels. Each panel of the plurality of display panels is mounted onto a mechanical support structure. The method further includes identifying a defective panel from the plurality of display panels. Without powering down the multi-panel display, electrical connection to the defective panel is disconnected and the defective panel is removed from the mechanical support structure. The method also includes attaching a replacement display panel to the mechanical support structure at the location of the defective panel, and connecting power to the replacement display panel. One or more of the remaining of the plurality of display panels continue to display during the time the defective panel is disconnected and removed, and the replacement display is attached.

In accordance with another embodiment of the present invention, a method for servicing a multi-panel display, where the multi-panel display including a plurality of display panels mounted on a mechanical support structure, includes receiving an indication that a panel of the plurality of display panels needs to be serviced, and providing access to a rear side of the multi-panel display. The opposite front side includes a display surface. The method further includes locating the panel to be serviced from amongst the plurality of display panels, and removing the panel to be serviced from the mechanical support structure without turning off power to the remaining plurality of display panels. The method includes attaching a new display panel to the mechanical support structure to replace the panel to be serviced, and connecting power to the new display panel. One or more of the remaining of the plurality of display panels continue to display during the time the panel to be serviced is removed and a new display is attached.

In accordance with an embodiment of the present invention, a control server includes a receiver to receive a signal indicating a health of a plurality of multi-panel display system being monitored by the control server. A processor is configured to execute instructions to identify a multi-panel display needing servicing based on the received signal, and identify a geographic physical address of the multi-panel display needing servicing based on an internal database, and generate a message requesting servicing.

In accordance with an embodiment of the present invention, a multi-panel display includes a mechanical support structure and a plurality of display panels mounted on the mechanical support structure. Each panel of the plurality of display panels is configured to be hot-swappable. Each panel is configured to be disconnected electrically and removed from the mechanical support structure without powering down the multi-panel display.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Installation of large display panels is a labor intensive process requiring skilled labor working in dangerous conditions for extended times. For example, to install a conventional display on a large multi-story building, the installers have to climb to the mounting wall (typically many stories high) and individually screw in each display and the corresponding cables etc. This is both time consuming and poses a significant safety threat thereby increasing the cost of the system dramatically. Further, when a particular display becomes defective during operation, the cost of replacement can be very high due to need for a highly skilled person to work in such difficult working conditions. The defective display has to be individually removed and replaced from the housing or cabinet in which it is mounted.

Embodiments of the invention provide preassembled display panel units, each of which provides a completely self-contained building block that is lightweight. Consequently, replacement of defective units is very simple and a person with no skill can easily remove and replace a defective display. Accordingly, embodiments of the present invention significantly reduce the operating cost of the display.

These display units are designed to be weather proof, without a heavy cabinet, although it is understood that the present disclosure may be applied to lighting for any type of interior and/or exterior display. The lightweight design allows for easier installation and maintenance, thus lowering total cost of ownership.

Embodiments of the invention provide building block panels that are configurable with future expandability. These displays can offer complete expandability to upgrade in the future without having to replace the entire display. Installation is fast and easy with very little down-time, which allows any electronic message to be presented more quickly.

In various embodiments, the display panels are "hot swappable." By removing one screw in each of the four corners of the panel, servicing the display panel is fast and easy. Since a highly-trained, highly-paid electrician or technician is not needed to correct a problem, cost benefits can be achieved.

Figure 1:
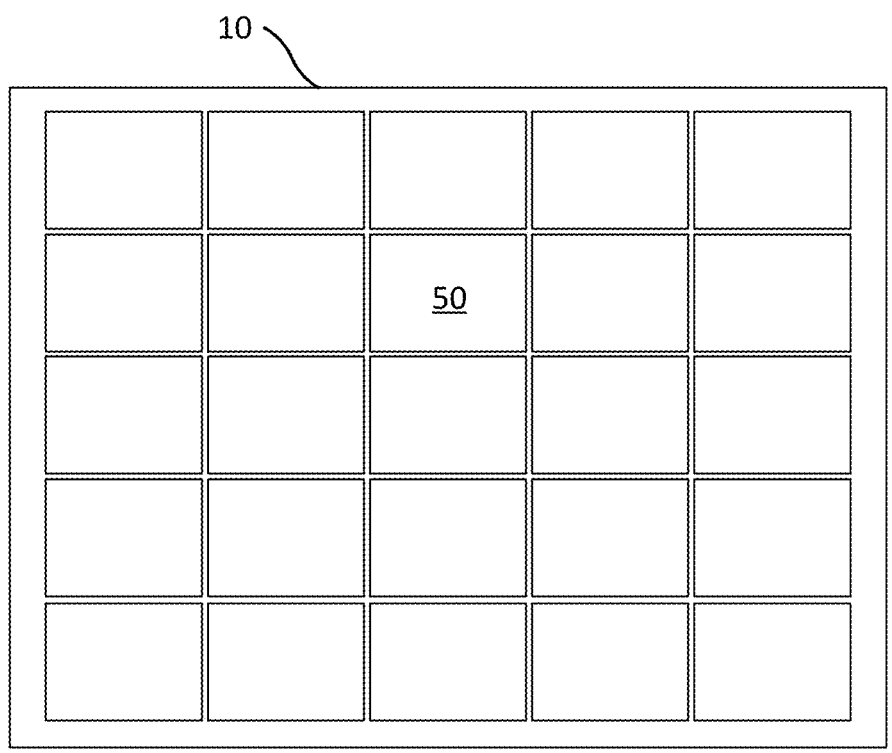
FIG. 1 illustrates a modular multi-resolution display system in accordance with embodiments of the present invention.
Figure 2:
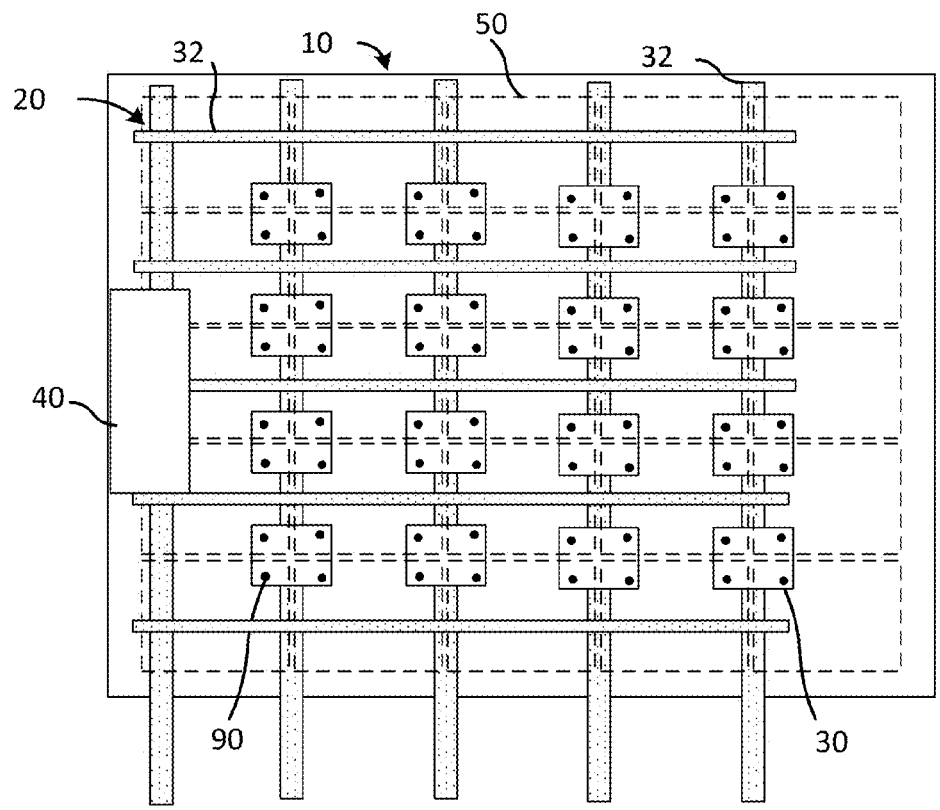
FIG. 2 illustrates a modular display panel attached to a supporting frame in accordance with an embodiment of the present invention.
Figure 3:
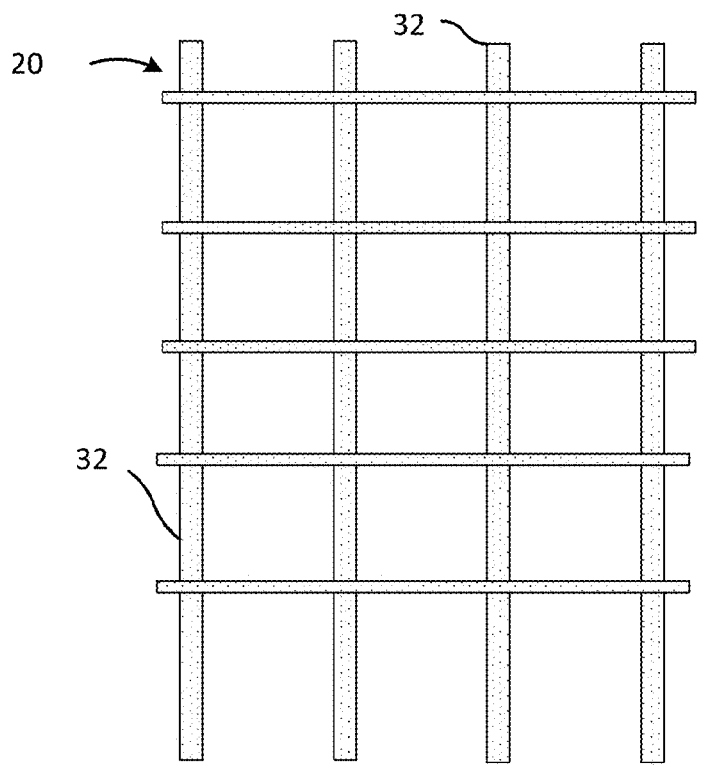
FIG. 3 illustrates a frame used to provide mechanical support to the modular display panel in accordance with an embodiment of the present invention.

FIG. 1 illustrates a modular display panel in accordance with an embodiment of the present invention. FIG. 2 illustrates a modular display panel attached to a supporting frame in accordance with an embodiment of the present invention. FIG. 3 illustrates a frame used to provide mechanical support to the modular display panel in accordance with an embodiment of the present invention.

The multi-panel modular preassembled display unit 10 comprises a plurality of LED display panels 50. In various embodiments describe herein, the light emitting diode (LED) display panels 50 are attached to a frame 20 or skeletal structure that provides the framework for supporting the LED display panels 50. The LED display panels 50 are stacked next to each other and securely attached to the frame 20 using attachment plate 30, which may be a corner plate in one embodiment. The attachment plate 30 may comprise holes through which attachment features 90 may be screwed in, for example. In alternative embodiments, any suitable attachment mechanism may be used.

Referring to FIGS. 1 and 2, the LED display panels 50 are arranged in an array of rows and columns. Each LED display panel 50 of each row is electrically connected to an adjacent LED display panel 50 within that row.

Referring to FIG. 3, the frame 20 provides mechanical support and electrical connectivity to each of the LED display panels 50. The frame 20 comprises a plurality of beams 32 forming the mechanical structure. The frame 20 comprises a top bar, a bottom bar, a left bar, a right bar, and a plurality of vertical bars extending from the top bar to the bottom bar, the vertical bars disposed between the left bar and the right bar. The top bar, the bottom bar, the left bar and the right bar comprise four inch aluminum bars and wherein the vertical bars comprise 2"×4"×½" aluminum tubes. The top bar, the bottom bar, the left bar and the right bar are each capable of bearing a load of 1.738 lb/ft and the vertical bars are each capable of bearing a load of 3.23 lb/ft.

The frame 20 may include support structures for the electrical cables, data cables, electrical power box powering the LED displays panels 50, data receiver box controlling power, data, and communication to the LED displays panels 50.

However, the frame 20 does not include any additional enclosures to protect the LED panels, data, power cables from the environment. Rather, the frame 20 is exposed to the elements and further exposes the LED display panels 50 to the environment. The frame 20 also does not include air conditioning, fans, heating units to maintain the temperature of the LED display panels 50. Rather, the LED display panels 50 are hermetically sealed themselves and are designed to be exposed to the outside ambient. Further, in various embodiments, there are no additional cabinets that are attached to the frame 20 or used for housing the LED display panels 50. Accordingly, in various embodiments, the multi-panel modular preassembled display unit 10 is designed to be only passively cooled.

Figure 4:
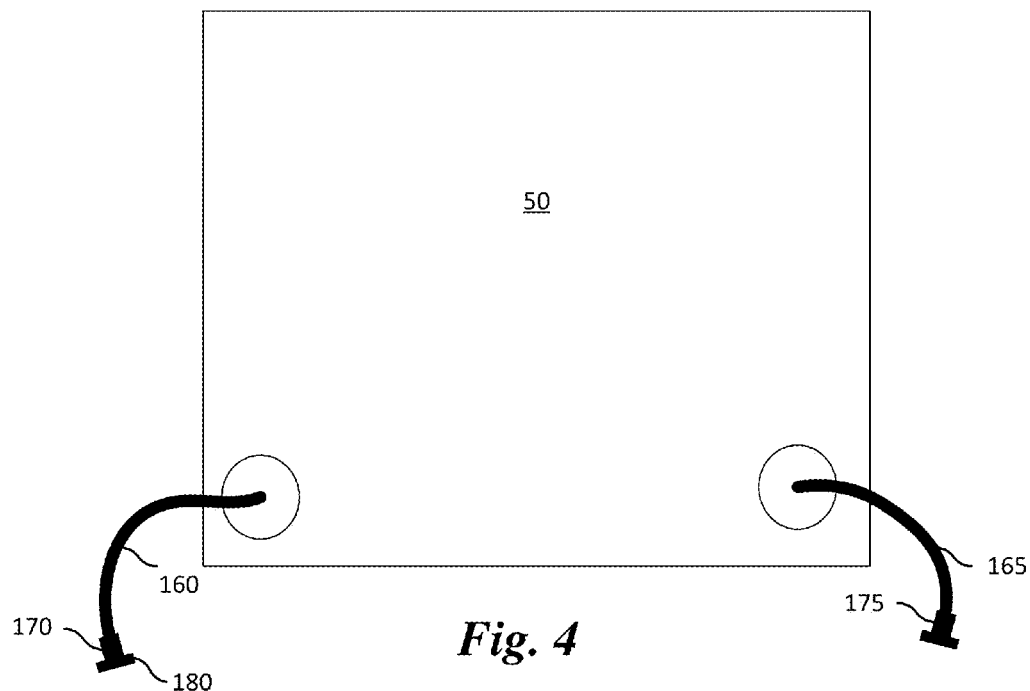
FIG. 4 illustrates one unit of the modular display panel in accordance with an embodiment of the present invention.

FIG. 4 illustrates one display panel 50 of the multi-panel modular preassembled display unit 10 comprising an input cable 160 and an output cable 165. The LED display panels 50 are electrically connected together for data and for power using the input cable 160 and the output cable 165.

Each modular LED display panel 50 is capable of receiving input using an integrated data and power cable from a preceding modular LED display panel and providing an output using another integrated data and power cable to a succeeding modular LED display panel. Each cable ends with an endpoint device or connector, which is a socket or alternatively a plug.

Referring to FIG. 4, in accordance with an embodiment, a LED display panel 50 comprises an attached input cable 160 and an output cable 165, a first connector 170, a second connector 175, a sealing cover 180. The sealing cover 180 is configured to go over the second connector 175 thereby hermetically sealing both ends (first connector 170 and the second connector 175). The sealing cover 180, which also includes a locking feature, locks the two cables together securely. The input cable 160 and the output cable 1365 comprise integrated data and power wires with appropriate insulation separating them.

Figure 5:
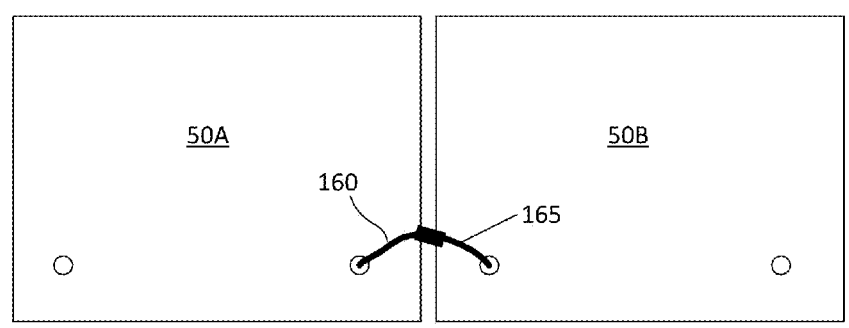
FIG. 5 illustrates a magnified view of two display panels next to each other and connected through the cables such that the output cable of the left display panel is connected with the input cable of the next display panel in accordance with an embodiment of the present invention.

FIG. 5 illustrates two display panels next to each other and connected through the cables such that the output cable 165 of the left display panel 50A is connected with the input cable 160 of the next display panel 50B. The sealing cover 180 locks the two cables together as described above.

Figure 6A:
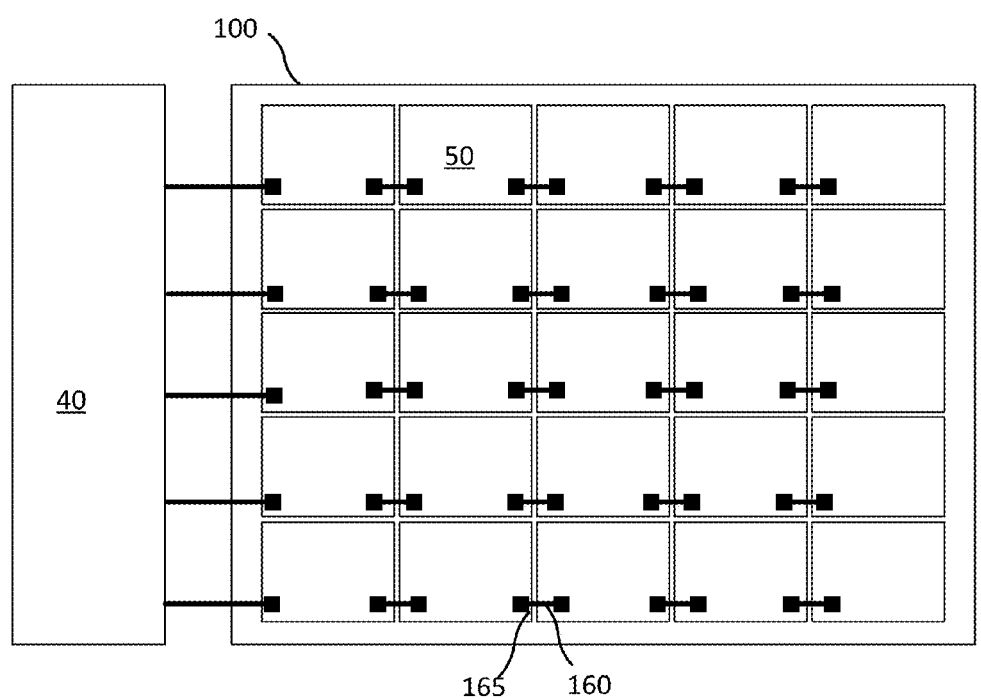
FIG. 6A illustrates a modular multi-panel display system comprising a plurality of LED display panels connected together using the afore-mentioned cables in accordance with an embodiment of the present invention.

FIG. 6A illustrates a modular multi-panel display system comprising a plurality of LED display panels connected together using the afore-mentioned cables.

Referring to FIG. 6A, for each row, a LED display panel 50 at a first end receives an input data connection from a data source and has an output data connection to a next LED display panel in the row. Each further LED display panel 50 provides data to a next adjacent LED display panel until a LED display panel 50 at second end of the row is reached. In one embodiment, the power line is run across each row to power the LED display panels 50 in that row. In another embodiment, panels 50 in one or more underlying rows may be connected serially as well.

In one embodiment, the plurality of LED display panels 50 are arranged in ten rows and thirty-two columns so that the integrated display panel 100 has a display surface that is approximately fifty feet and four inches wide and fifteen feet and eight and three-quarters inches high.

In various embodiments, as illustrated in FIGS. 2 and 6A, an optional data receiver box 40 is mounted to the mechanical support structure or frame 20. The data receiver box 40 is configured to provide power, data, and communication to the LED display panels 50. With a shared receiver box 40, the panels themselves do not need their own receiver card. This configuration saves cost and weight. However, in some embodiments, the receiver box and related circuitry (therefore it's functionality) may be included within the display panels 50.

Figure 6B:
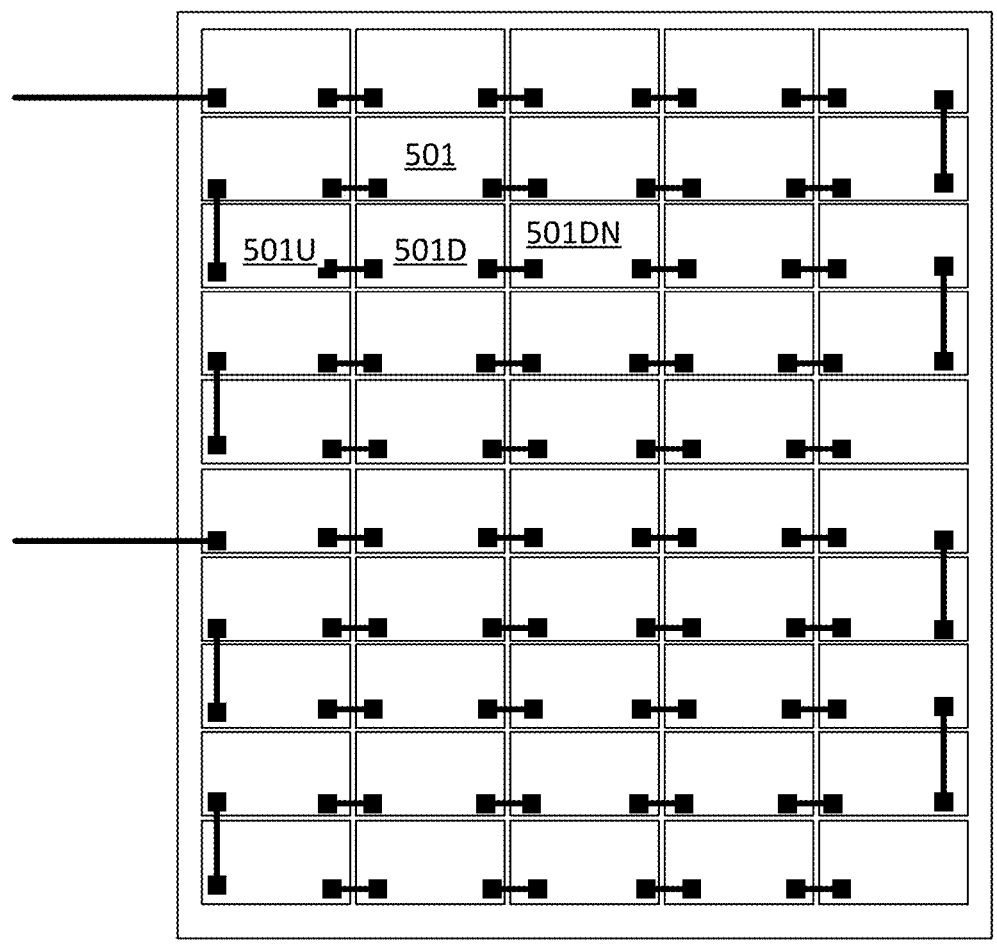
FIG. 6B illustrates an alternative embodiment of the modular multi-panel display system comprising a plurality of LED display panels connected together.

FIG. 6B illustrates an alternative embodiment of the modular multi-panel display system comprising a plurality of LED display panels connected together.

In an alternative embodiment, the multi-panel display system may comprise panels 501, where each panel 501 includes a network interface card and a power supply. Each panel 50 may include a unique MAC address/network card so that the device can be identified. The network interface card may be used to accomplish bidirectional communication with other panels as well as with other components outside the multi-panel display. In one or more embodiments, a single media process chip may include, i.e., integrate more than one component so that the functionality of the network interface card is included within a media processor chip within the panel 501. In other embodiments, the panel 501 may include a separate housing for the network interface card.

As illustrated in FIG. 6B, the panel 501 may include a defective panel 501D that requires to be replaced. Further, upstream panels 501U and downstream panels 501DN in the neighborhood of the defective panel 501D may not be impacted during the replacement process. For example, during the hot swapping process, the upstream and downstream panels 501U and 501DN may be working and displaying content if they are powered independently. Alternatively, the downstream panels 501DN may be turned off if power to the downstream panels 501DN is interrupted during the hot-swapping.

Figure 7:
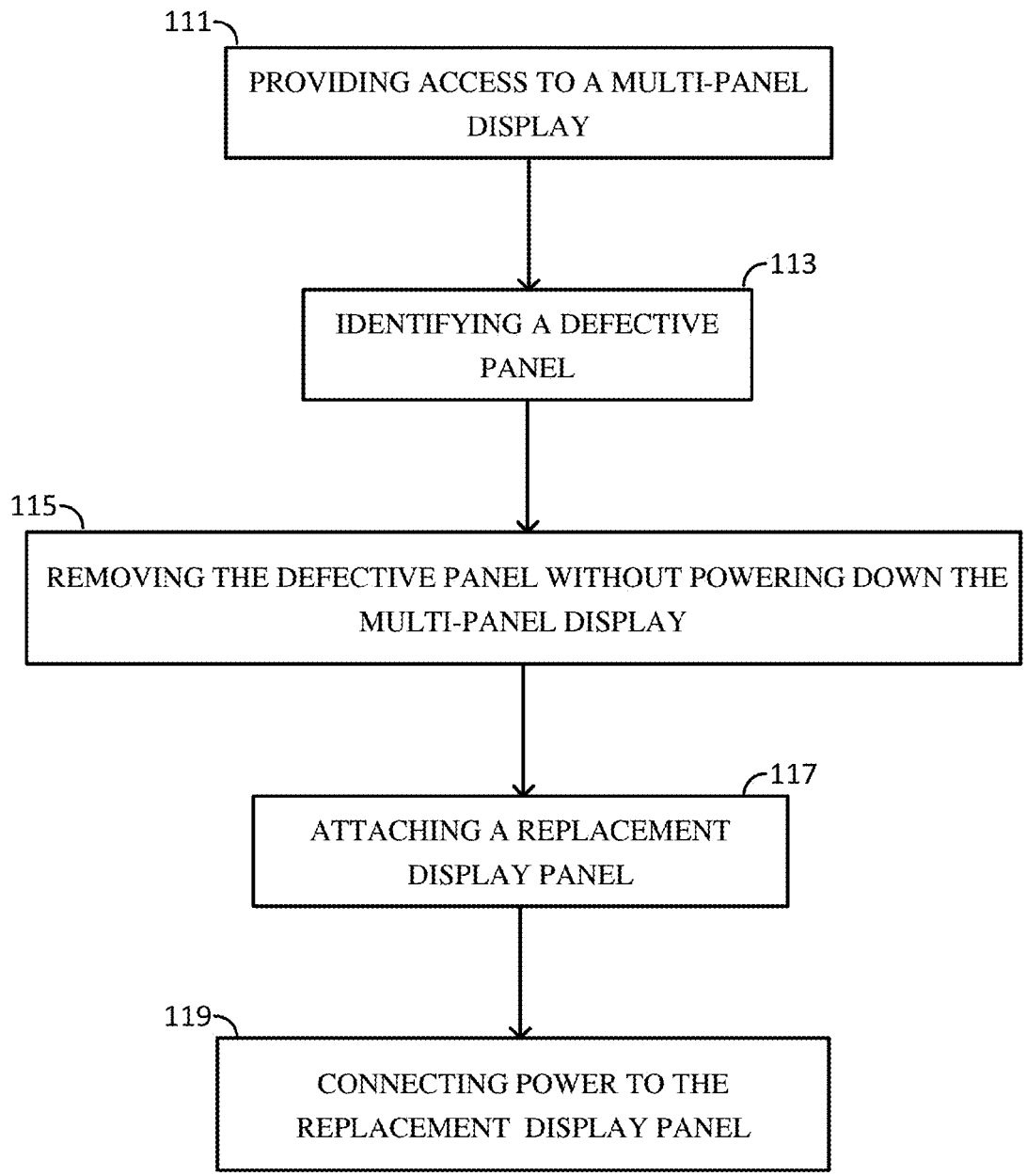
FIG. 7 illustrates a method of performing a maintenance operation in accordance with an embodiment of the present invention.

FIG. 7 illustrates a method of performing a maintenance operation in accordance with an embodiment of the present invention.

In various embodiments, physical access is provided to the multi-panel display comprising a plurality of display panels (box 111). For example, access may be provided from the back side through a cat walk or through other support.

Referring to FIG. 7, a defective panel is identified from the plurality of display panels (box 113). In various embodiments, this identification may be performed manually or through a monitoring circuit. Examples of self-monitoring include a camera based system having a field of view of the display and/or other electrical circuits to detect power consumed, modulation in current, voltage, frequency of the input or output. Alternatively, each display panel may include a self-monitoring circuit to monitor its own display and/or an adjoining neighboring display. In further embodiments, a monitoring circuit may include a sensor to measure the output parameters such as light intensity, brightness, and others. For example, a spatial variation in the brightness emanating from the panels may be used to identify a panel that has stopped displaying or has gone black.

In one embodiment, a signal indicating a type of repair service needed is received at a central server or monitoring server. In an alternative embodiment, signal indicating the defect or defect type is received at a central server or monitoring server. In a further embodiment, the signal indicating the defect is received from a central monitoring circuit for the multi-panel display, a panel adjacent to the defective panel, or the defective panel itself.

Referring further to box 115, the electrical connection to the defective panel is disconnected without powering down the multi-panel display. As a consequence, all panels in the upstream of the defective panel may still be working (if they have a separate ground connection to complete the electrical connection). The defective panel is next removed from the mechanical support structure on which it is mounted.

As next illustrated in box 117, a replacement display panel is attached to the mechanical support structure at the location of the defective panel. The replacement display panel may be a new panel or a panel that has been previously removed and repaired.

After attaching the replacement display panel, the power and data connections are restored to the new display panel (box 119). Accordingly, advantageously, one or more of the remaining of the plurality of display panels continue to display during the time the defective panel is disconnected and removed, and the replacement display is attached.

Figure 8:
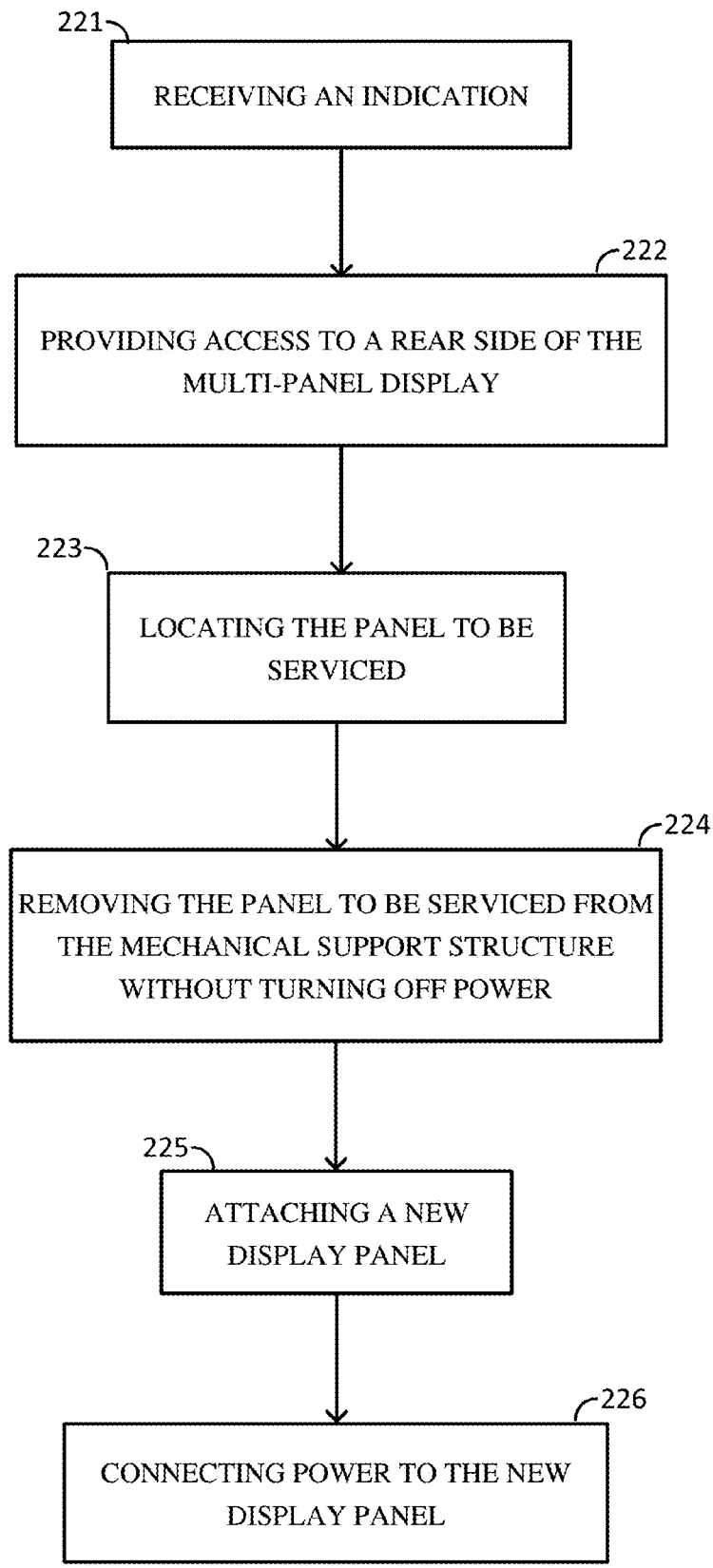
FIG. 8 illustrates a method of performing a maintenance operation in accordance with an alternative embodiment of the present invention.

FIG. 8 illustrates a method of performing a maintenance operation in accordance with an alternative embodiment of the present invention.

In accordance with an embodiment of the present invention, an indication is received at a control server or other central monitoring unit that a panel of the plurality of display panels needs to be serviced (box 221). The indication may be a signal indicating a type of repair service needed or may be a signal from the panel to be serviced. In one embodiment, the indication may be a signal from an adjacent panel indicating a defect in the panel to be serviced or a signal from a control box indicating a defect in the panel to be serviced, the control box being a central monitoring unit for monitoring all of the plurality of display panels.

Next, a service personal is provided access to a rear side of the multi-panel display (box 222). The rear side is opposite front side comprising a display surface. Accordingly, the design of the multi-panel display is such that a service personal is able to access the rear side of the display. For example, this may be accomplished from a catwalk behind the display.

The panel to be serviced is located from amongst the plurality of display panels (box 223). In one embodiment, the service personal may identify the defective panel with an identification number. Alternatively, other tags including electronic tags may be used to identify the defective part. For example, the service personal may use an electronic reader which reads information from the display to be serviced.

The panel to be serviced is removed from the mechanical support structure without turning off power to the remaining plurality of display panels (box 224). A new or replacement display panel is attached to the mechanical support structure to replace the panel to be serviced (box 225). The panel that has been replaced is connected to power (box 226).

Any panel whose power is not disrupted continues to display during the time that the defective panel is being replaced. Accordingly in various embodiments, one or more of the remaining of the plurality of display panels continue to display during the time the panel to be serviced is removed and a new display is attached.

Figure 9:
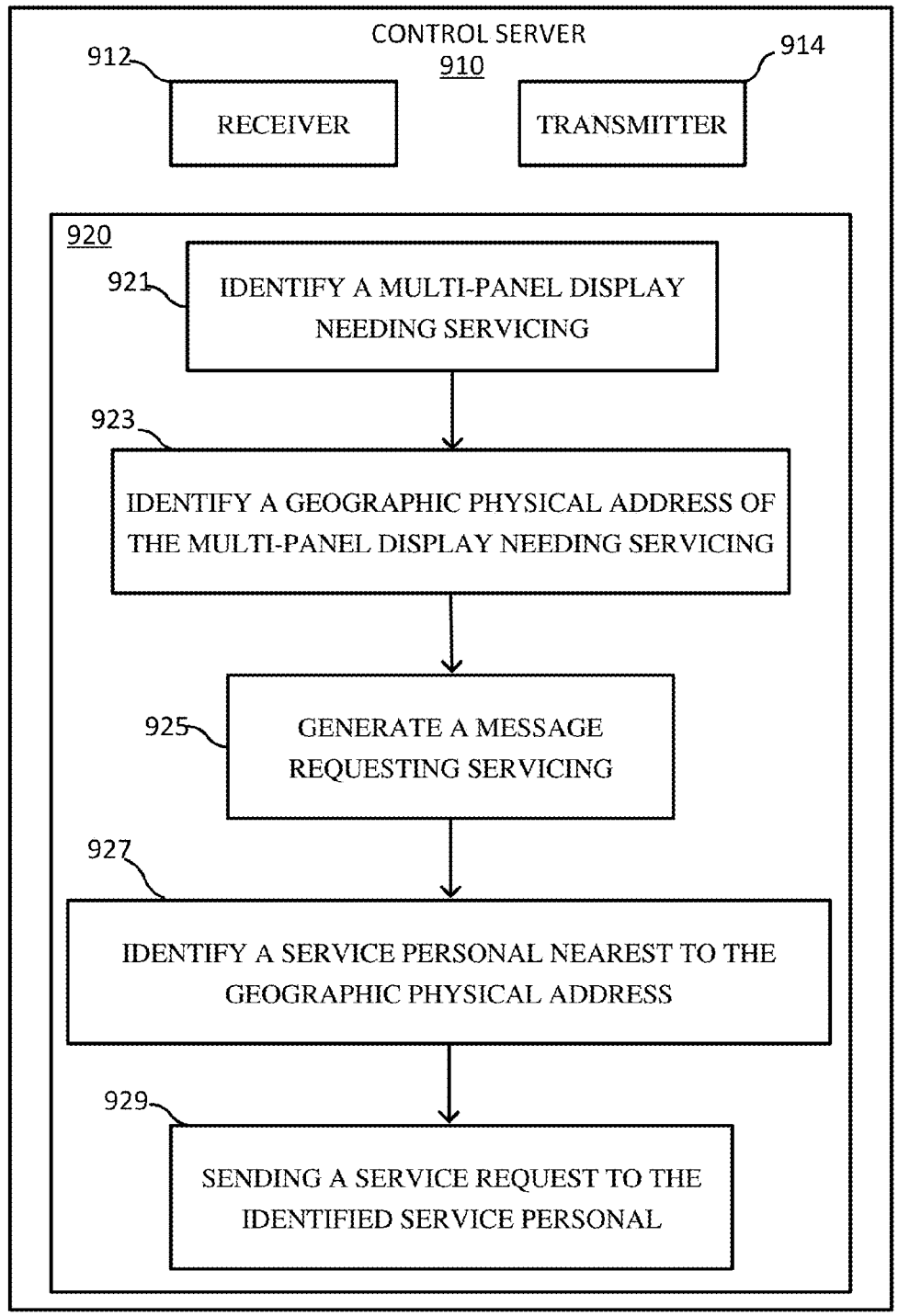
FIG. 9 illustrates a control server in accordance with an alternative embodiment of the present invention.

FIG. 9 illustrates a control server in accordance with an alternative embodiment of the present invention.

The control server may be a central monitoring facility connected to the billboard or a multi-panel display system and monitoring the functioning of the multi-panel display system along with several other display systems at possibly different locations.

The control server 910 includes a transmitter 914 for transmitting outgoing transmission signals and a receiver 912 for receiving incoming signals. For example, the transmitter 914 and the receiver 912 may be coupled to a common antenna in one exemplary embodiment. In one embodiment, the receiver 912 is configured to receive a signal indicating a health of the multi-panel display system that is being monitored by the control server 910.

In various embodiments, the control server 910 includes a storage medium and a processor. The storage medium includes instructions to execute instructions to identify a multi-panel display needing servicing based on the received signal (box 921) and identify a geographic physical address of the multi-panel display needing servicing based on an internal database (box 923). Further, the instructions generate a message requesting servicing (box 925) and identify a service personal nearest to the geographic physical address (box 927). The instructions may further be configured to send a service request to the identified service personal (box 929). In one embodiment, this service request may be performed automatically so that no user involvement is needed. Alternatively, in another application, a monitoring personal may decide who and when to schedule the service request.

The processor may be configured to execute the above instructions. For example, the processor is configured to identify a multi-panel display needing servicing based on the received signal, identify a geographic physical address of the multi-panel display needing servicing based on an internal database, and generate a message requesting servicing.

Figure 10A:
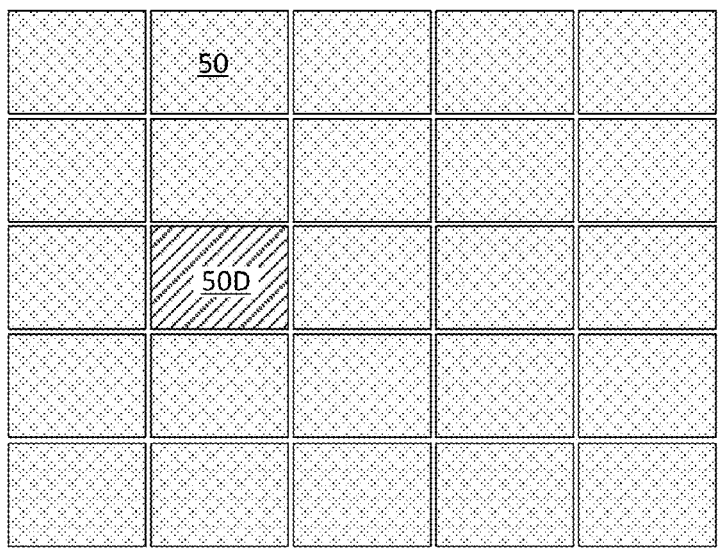
FIGS. 10A-10C illustrates the replacement of a defect panel in accordance with an embodiment of the present invention.
Figure 10B:
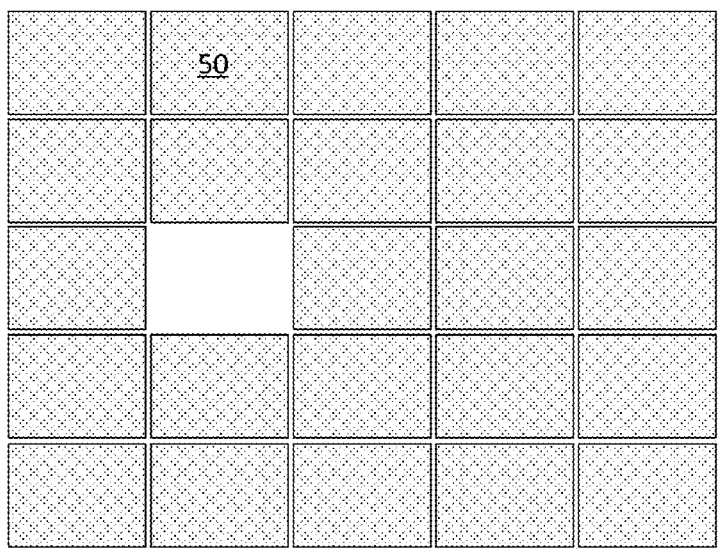
Figure 10C:
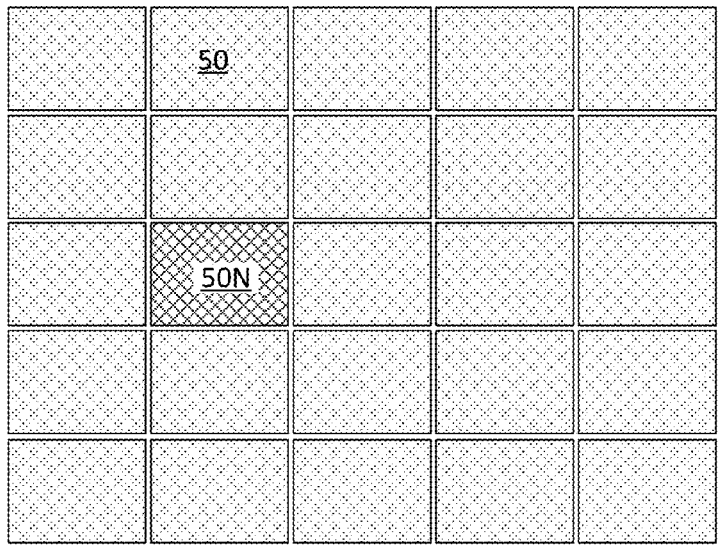

FIGS. 10A-10C illustrates the replacement of a defect panel in accordance with an embodiment of the present invention.

Referring to FIG. 10A, a defective panel 50D is identified for replacement. Without powering off the system, the defective panel 50D is removed as illustrated next in FIG. 10B. Accordingly, panels not receiving any power (e.g., downstream devices) or devices with an open circuit after removal of the defective panel 50D are turned off. However, the other panels continue to display during this time. As next illustrated in FIG. 10C, a good panel is mounted back to replace the defective panel. In various embodiments, the good panel may be a new panel or a previously defective panel that has been repaired. In some embodiment, the replacement of the panels described in FIG. 10 may be performed for other reasons than the removal of defective panels. For example, some of the panels may be replaced with a newer technology or model of the panels having improved features. In some cases, only a few panels may be replaced with the newer model due to various reasons such as cost, field testing, and others. Embodiments of the present invention envision such testing and replacement.

Figure 11A:
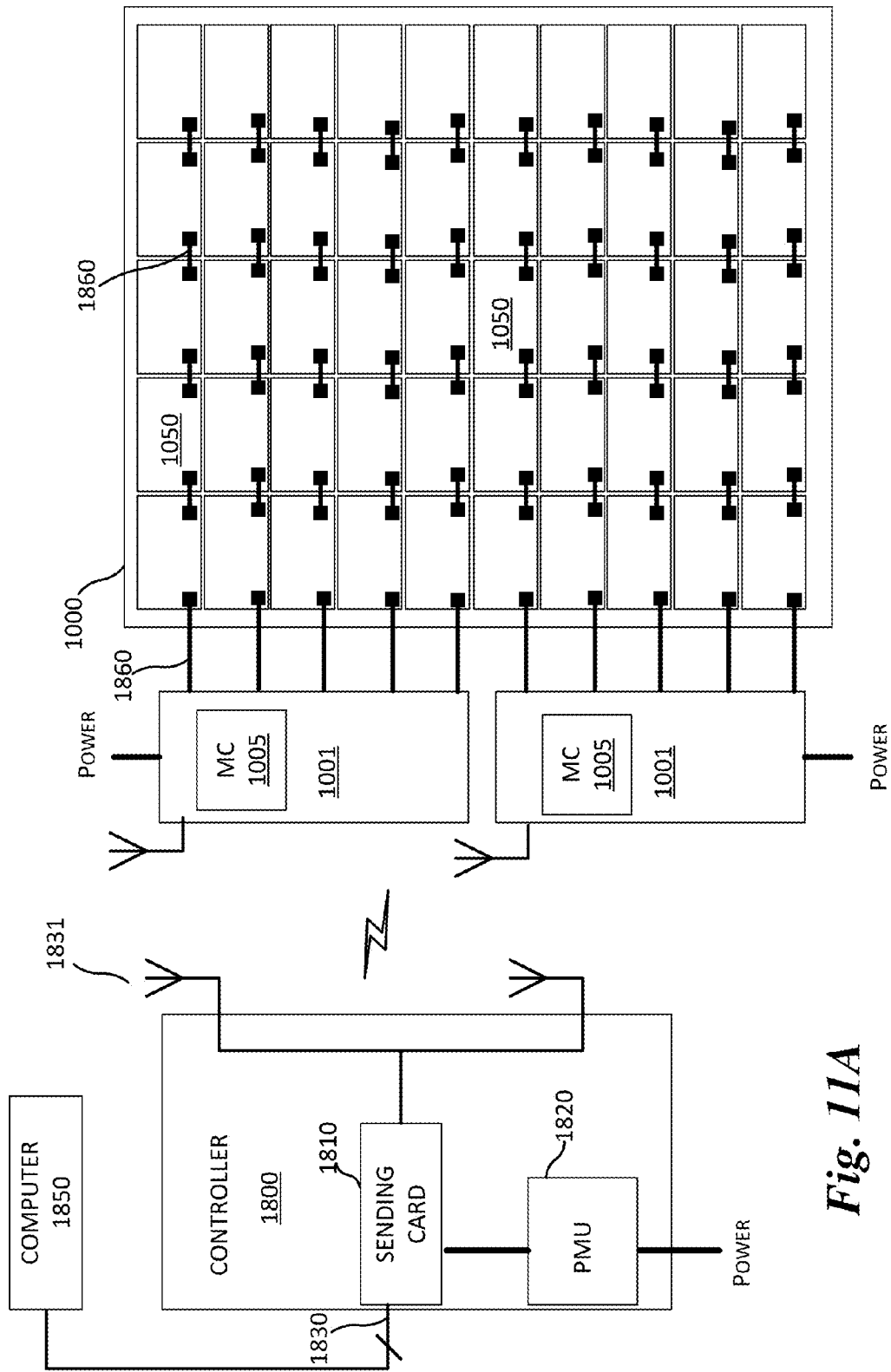
FIG. 11A illustrates an embodiment of the present invention describing a monitoring controller disposed within a data receiver box.

FIG. 11A illustrates an embodiment of the present invention describing a monitoring controller 1005 disposed within a data receiver box 901. The monitoring controller 1005 is configured to monitor power failure in one or more display panels 1050 and report to the computer 1850 or to a different receiving monitoring server. In various embodiments, the monitoring controller 1005 is configured to monitor illumination or brightness of one or more panels. The monitoring controller 1005 may also monitor the network between the data receiver box 1001 and the outside internet including computer 1850 as well as the local area network (or equivalent wireless network) connecting the individual display panels 1050 of the display system 1000.

The monitoring controller 1005 may be used for other purposes as well. For example, in one or more embodiments, the display panels 1050 may include one or more sensors to self-regulate operation based on external conditions. For example, the sensor may reduce or increase the brightness of the display panels based on the ambient light. Alternatively, in some embodiments, the display panels may sense the presence of an observer (e.g., human) and modulate the content being displayed. For example, the display may be powered off until a human approaches the display.

The data receiver box 1001 may include wired data connection as well as wireless data connection. Accordingly, for example, if a network failure is detected, the monitoring circuit 1005 may generate an error message, which is then transmitted to a monitoring server or the computer 1850 using the wireless channel.

Figure 11B:
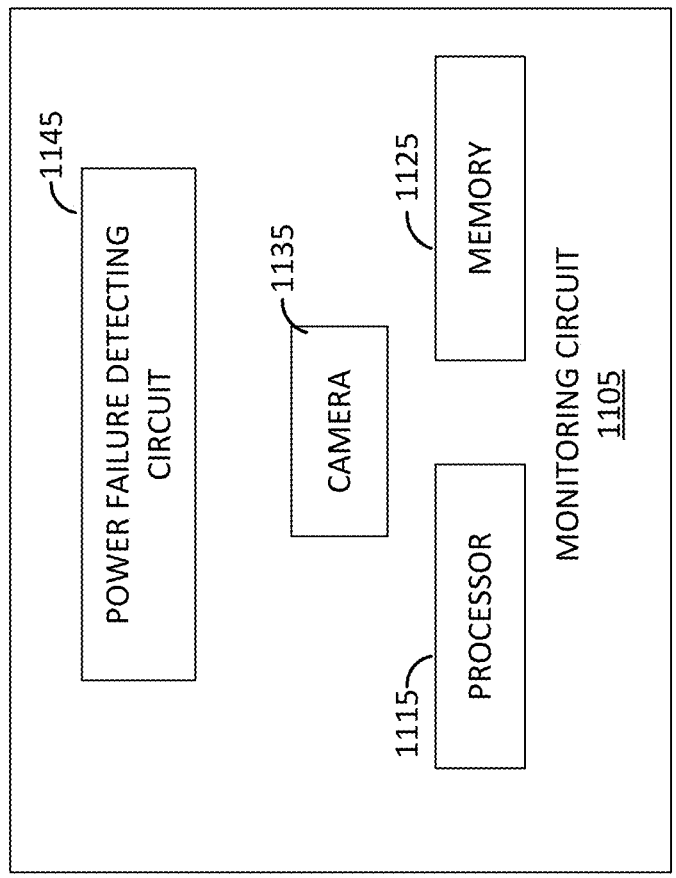
FIG. 11B illustrates a general schematic of a monitoring circuit in accordance with an embodiment of the present invention.

FIG. 11B illustrates a general schematic of a monitoring circuit in accordance with an embodiment of the present invention.

In one or more embodiments, as illustrated in FIG. 11B, a monitoring circuit 1105 may include a power failure detecting circuit 1145, a camera 1135, which may include both visible, infrared and other spectrum to collect additional information. The monitoring circuit 1105 may include a processor 1115 or may use the common processor within the data receiver box. The camera may be automatically periodically activated to image the display system. The image may be processed to identify any issues with the display. For example, using an image processing software executing on the processor 1115, the power failure, dark pixels, lowered brightness may be detected. In case of a failure, a failure message is generated and transmitted to a monitoring server.

The monitoring circuit 1105 may include a memory 1125 to store the images and the results of the processing. In one or more embodiments, the monitoring circuit may include only a camera 1135. In one embodiment, the camera 1135 may be a sensor to measure brightness.

The processing may be performed remotely, for example, in some embodiments. The camera 1135 may periodically capture images of the display system and send the unprocessed image to a monitoring server performing the remaining monitoring functions. Accordingly, a more detailed image processing analysis may be performed at the remote media server, which is likely to have better computational power than the on-site processing at the display.

Figure 12:
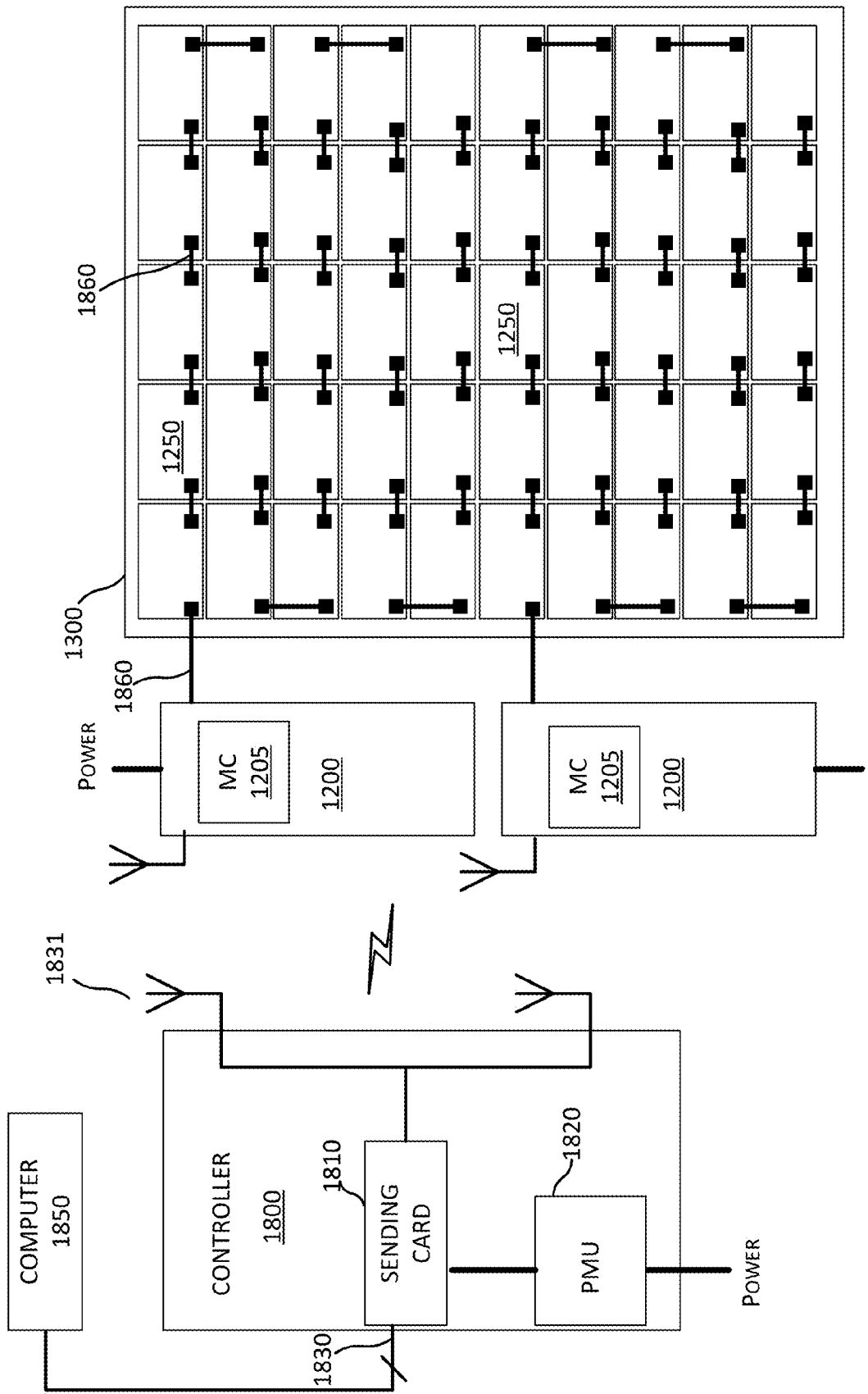
FIG. 12 illustrates an embodiment of the present invention in which the display panels are connected serially.

FIG. 12 illustrates an embodiment of the present invention in which the display panels 1250 are connected serially.

In this embodiment, each individual display panel 1250 includes a media processing chip comprising a network interface card. Thus each panel has an individual media access control (MAC) address, which enables each display panel 1250 to communicate in both directions (receive and send data).

In one or more embodiments, the display panels 1250 may be powered using a serial connection. In this embodiment, the use of a monitoring circuit 1205 within the data receiver box 1200 may be optional because each individual panel may be configured to communicate bidirectionally. Accordingly, the functioning of the monitoring circuit 1205 may be incorporated into the individual panel. For example, each panel 1250 may include software and/or hardware to perform the monitoring functions. If a defect is identified within the panel 1250 (or on an adjacent panel), the panel 1250 communicates the detection of the defect to the controller 1800.

Figure 13:
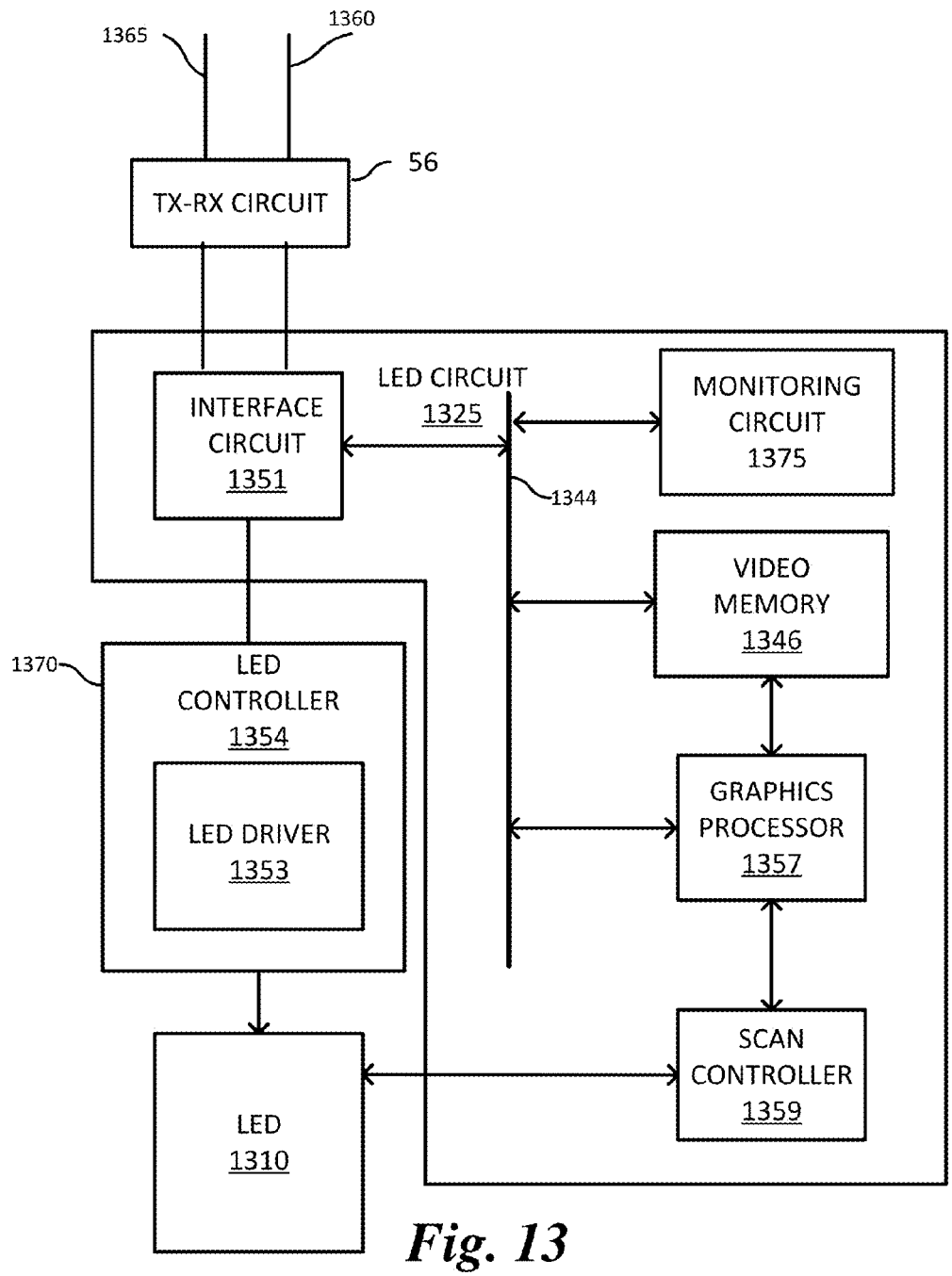
FIG. 13 illustrates a more detailed schematic of the circuit with a LED circuit showing a separate TX-RX circuit for establishing bidirectional communication.

FIG. 13B illustrates a more detailed schematic of the circuit with a LED circuit 1325 showing a separate TX-RX circuit 56 and a monitoring circuit 1375 for monitoring the panel and communicating using the established bidirectional communication. The TX-RX circuit 56 may include a unique MAC address/network card so that the device can be identified. In one or more embodiments, a single media process chip may include, i.e., integrate more than one component listed. For example, a single media processing chip is used to power and render images using the LED 1310. The media processing chip may include the functions of the TX-RX circuit 56, interface circuit 1351, bus 1344, video memory 1346, graphics processor 1357, scan controller 1359. The LED controller 1354 with the LED driver 1353 may be part of a different chip or may also be integrated.

The monitoring circuit 1375 may be implemented in software and/or hardware and may be instructions to be performed using the graphics processor 1357 or other processor available to the monitoring circuit 1375. The monitoring circuit 1375 may also include sensors such as temperature sensor, optical sensor including ambient light sensor, magnetic sensor, current sensor, power sensor, as well as other sensors. Based on the results from the sensor, the monitoring circuit 1375 determines the need to communicate with the receiver box or with a remote monitoring computer. In one embodiment, an error message is generated by the monitoring circuit 1375 identifying the type of defect and the ID of the panel and then transmitted using the TX-RX circuit 56.

Figure 14:
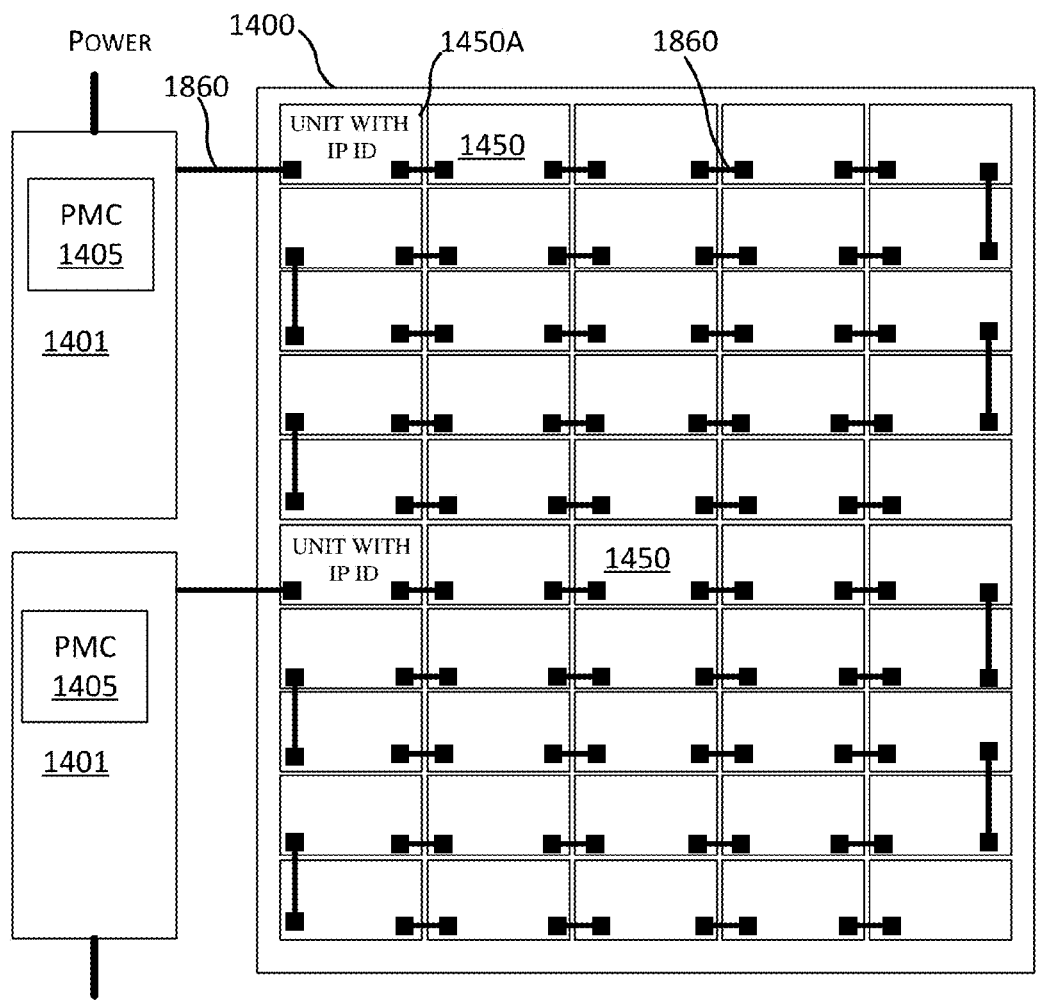
FIG. 14 illustrates an embodiment of the display system in which the data receiver box has minimal functionality.

FIG. 14 illustrates an embodiment of the display system in which the data receiver box 1400 has minimal functionality.

The data receiver box 1401 may simply connect the first display panel of the display system 1400 with an interconnect (TCP/IP) port. The first display panel may include an identifier for the whole system so that the display system advertises a single IP address. For example, the IP address of the display system 1400 may be identified from the first display panel 1450A. The remaining panels 1450 may be daisy chained.

The media processing chip within each display panel 1450 identifies and processes the correct media that is to be displayed from the data stream that includes all the media for all the panels in the chain.

The first panel in the series of panels includes a unique IP address. Thus, when connected to the internet, the network card at the first display panel 1450A receives the data to be displayed by all the panels within the same series. The remaining panels use the data processed through the common network card at the first network. The remaining panels have to be calibrated so that they know which portion of the data is to be displayed by that particular unit.

In one or more embodiments, the first display panel 1450A may include a monitoring circuit for monitoring the status of one or more panels being serviced by the first display panel 1450A.

Figure 15:
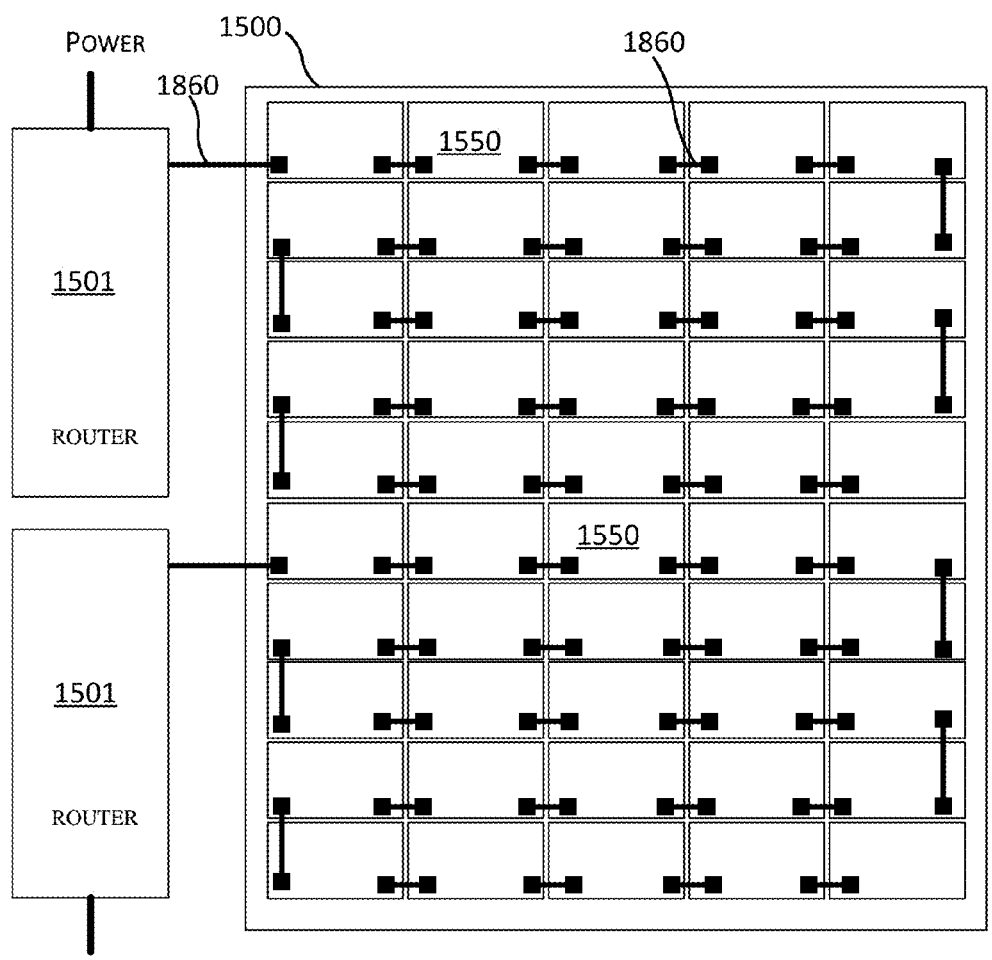
FIG. 15 illustrates an alternative embodiment of the present invention.

FIG. 15 illustrates an alternative embodiment of the present invention.

In this embodiment, a router 1501 is coupled between the display panels 1550 and the internet. The router 1501 may be coupled to a plurality of display panels 1550, where each panel has its own network interface card each thereby having its unique MAC address.

In some embodiments, the first display panel may include the router 1501, i.e., the router 1501 may be integrated into the first display panel. The devices within the local area of the router may now be individually addressed using the display panels' 1550 respective MAC address. Accordingly, packets destined to each panel are routed by the router 1501. In this embodiment, the display panels 1550 within a single display system 1500 may be served from different locations. For example, a larger part of the screen may show an advertisement from a media server whereas a lower portion may show the temperature from a weather server or a sports score from a sport network server.

In one or more embodiments, each of the display panel 1550 may include a monitoring circuit for monitoring the status of one or more panels.

Figure 16:
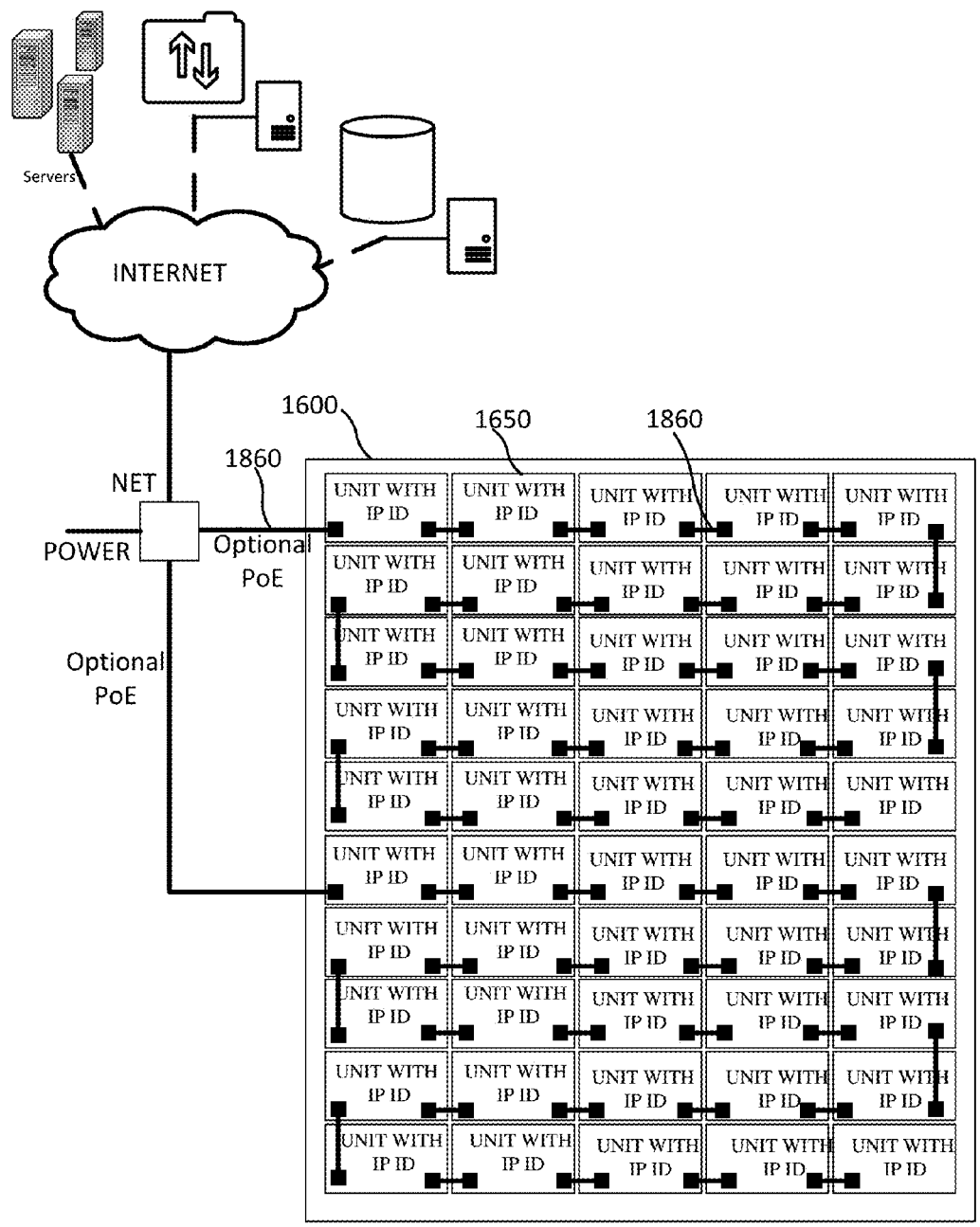
FIG. 16 illustrates an alternative embodiment of the present invention in which each display panel has a unique IPV6 IP address.

FIG. 16 illustrates an alternative embodiment of the present invention in which each display panel has a unique IPV6 IP address.

In this embodiment, each display panel 1650 of the display system 1600 has a unique IP address, for example, an IPV6 IP address. The media to be displayed may be split at the source of a single media server or may be obtained from multiple media server through the internet. For example, different portions of the display system 1600 may be leased to a different company displaying its own content. This embodiment enables multiple users to share a single display board. For example, an expensive display location may be shared in time or space by multiple companies reducing their costs while improving effectiveness of the display. The display panels may be powered individually or through Power over Ethernet technologies using cat5, cat6 cables.

In one or more embodiments, each of the display panel 1650 may include a monitoring circuit for monitoring the status of one or more panels.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   providing access to a multi-panel display comprising a plurality of display panels, each panel of the plurality of display panels being mounted onto a mechanical support structure;
   identifying a defective panel from the plurality of display panels, wherein identifying the defective panel comprises receiving a signal from an adjacent panel indicating the defect;
   without powering down the multi-panel display, disconnecting electrical connection to the defective panel and removing the defective panel from the mechanical support structure;
   attaching a replacement display panel to the mechanical support structure at the location of the defective panel; and
   connecting power to the replacement display panel, wherein one or more of the remaining of the plurality of display panels continue to display during the time the defective panel is disconnected and removed, and the replacement display is attached.

2. The method of claim 1, wherein identifying the defective panel from the plurality of display panels comprises determining at the plurality of display panels that the defective panel has a defect, wherein determining that the defective panel has the defect comprises determining that a power supply of the defective display panel is not converting power.

3. The method of claim 1, wherein identifying the defective panel from the plurality of display panels comprises determining at the plurality of display panels that the defective panel has a defect, wherein determining that the defective panel has the defect comprises determining that a pixel of the defective display panel is not drawing power.

4. The method of claim 1, wherein identifying the defective panel from the plurality of display panels comprises using a monitoring circuit to determine, at the plurality of display panels, that the defective panel has a defect.

5. The method of claim 1, wherein identifying the defective panel comprises receiving a signal indicating a type of repair service needed.

6. The method of claim 1, wherein identifying the defective panel comprises receiving a signal from the defective panel indicating the defect.

7. The method of claim 1, wherein identifying the defective panel comprises receiving a signal from a control box indicating the defect, the control box being a central monitoring unit for monitoring all of the plurality of display panels.

8. The method of claim 1, wherein disconnecting electrical connection to the defective panel comprises removing alternating current (AC) being supplied to the defective panel.

9. The method of claim 1, wherein disconnecting electrical connection to the defective panel comprises removing direct current (DC) being supplied to the defective panel.

10. The method of claim 1, further comprising:
    repairing the defective panel; and
    attaching the repaired defective panel to another mechanical support structure of another multi-panel display at a different location.

11. The method of claim 1, wherein each panel of the plurality of display panels comprises a power conversion unit to convert a received alternating current (AC) to direct current (DC).

12. The method of claim 11, wherein the power conversion unit is disposed in a separate housing outside each of the panel.

13. The method of claim 1, wherein the plurality of display panels comprises a first row of panels, a second row of panels, and a third row of panels, wherein the defective panel is located within the first row of panels, wherein all panels in the second row and the third row continue to display during the time the defective panel is disconnected and removed, and a new display is attached.

14. The method of claim 1, wherein identifying the defective panel comprises:
    receiving a signal indicating a health issue of the defective panel;
    determining which panel of the multi-panel display is the defective panel based on the received signal; and
    identify a geographic physical address of the multi-panel display.

15. The method of claim 14, further comprising monitoring the multi-panel display to identify health issues, the signal being received based on the monitoring.

16. The method of claim 14, further comprising generating a message requesting servicing.

17. The method of claim 14, further comprising:
    identifying a service personnel nearest to the geographic physical address of the multi-panel display needing servicing; and
    sending a service request to the identified service personnel.

18. The method of claim 17, wherein the identified service personnel performs the disconnecting, the attaching and the connecting.

19. A method for servicing a multi-panel display, wherein the multi-panel display comprises a plurality of display panels mounted on a mechanical support structure, the method comprising:
    receiving an indication that a panel of the plurality of display panels needs to be serviced, wherein receiving the indication comprises receiving a signal from an adjacent panel indicating a defect in the panel to be serviced;
    providing access to a rear side of the multi-panel display, the opposite front side comprising a display surface;
    locating the panel to be serviced from amongst the plurality of display panels;
    removing the panel to be serviced from the mechanical support structure without turning off power to the remaining plurality of display panels;
    attaching a new display panel to the mechanical support structure to replace the panel to be serviced; and
    connecting power to the new display panel, wherein one or more of the remaining of the plurality of display panels continue to display during the time the panel to be serviced is removed and a new display is attached.

20. The method of claim 19, wherein removing the panel to be serviced comprises removing alternating current (AC) being supplied to the panel to be serviced.

21. The method of claim 19, wherein receiving an indication that a panel of the plurality of display panels needs to be serviced comprises receiving a signal indicating a type of repair service needed.

22. The method of claim 19, wherein receiving an indication that a panel of the plurality of display panels needs to be serviced comprises receiving a signal from the panel to be serviced.

23. The method of claim 19, wherein receiving an indication that a panel of the plurality of display panels needs to be serviced comprises receiving a signal from a control box indicating a defect in the panel to be serviced, the control box being a central monitoring unit for monitoring all of the plurality of display panels.

24. The method of claim 19, wherein each panel of the plurality of display panels comprises a power conversion unit to convert a received alternating current (AC) to direct current (DC).

25. The method of claim 24, wherein the power conversion unit is disposed in a separate housing outside each of the panel.

26. The method of claim 19, wherein the plurality of display panels comprises a first row of panels, a second row of panels, and a third row of panels, wherein the panel to be serviced is located within the first row of panels, wherein all panels in the second row and the third row continue to display during the time the panel to be serviced is disconnected and removed, and a new display is attached.

27. A method comprising:
   providing access to a multi-panel display comprising a plurality of display panels, each panel of the plurality of display panels being mounted onto a mechanical support structure, wherein the plurality of display panels comprises a first row of panels, a second row of panels, and a third row of panels;
   identifying a defective panel from the plurality of display panels, wherein identifying the defective panel comprises receiving a signal from an adjacent panel indicating the defect, wherein the panel to be serviced and the adjacent panel are located within the first row of panels;
   disconnecting electrical connection to the defective panel;
   removing the defective panel from the mechanical support structure, wherein all the panels in the first row are powered down when an electrical connection to the panel to be serviced is disconnected;
   attaching a replacement display panel to the mechanical support structure at the location of the defective panel; and
   connecting power to the replacement display panel, wherein all panels in the second row and the third row continue to display during the time the panel to be serviced is disconnected and removed, and the replacement display is attached.

28. A method comprising:
   providing access to a multi-panel display comprising a plurality of display panels, each panel of the plurality of display panels being mounted onto a mechanical support structure, wherein the plurality of display panels comprises a first row of panels, a second row of panels, and a third row of panels;
   identifying a defective panel from the plurality of display panels, wherein identifying the defective panel comprises receiving a signal from an adjacent panel indicating the defect, wherein the defective panel is located within the first row of panels;
   disconnecting electrical connection to all the panels in the first row without powering down any panels in the second or third rows;
   removing the defective panel from the mechanical support structure;
   attaching a replacement display panel to the mechanical support structure at the location of the defective panel; and
   connecting power to the replacement display panel, wherein all panels in the second row and the third row continue to display during the time the defective panel is disconnected and removed, and the replacement display is attached.

* * * * *